(12) United States Patent
Zhang

(10) Patent No.: US 7,759,993 B2
(45) Date of Patent: Jul. 20, 2010

(54) ACCUMULATED PHASE-TO-DIGITAL CONVERSION IN DIGITAL PHASE LOCKED LOOPS

(75) Inventor: Gang Zhang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 12/187,321

(22) Filed: Aug. 6, 2008

(65) Prior Publication Data
US 2010/0033220 A1 Feb. 11, 2010

(51) Int. Cl.
*H03L 7/06* (2006.01)
(52) U.S. Cl. ...................................... 327/159; 327/150
(58) Field of Classification Search .............. 327/150, 327/159
See application file for complete search history.

(56) References Cited

U.S. PATENT DOCUMENTS

| 3,936,762 | A * | 2/1976 | Cox et al. ................... 327/159 |
| 7,124,153 | B2 | 10/2006 | Grushin |
| 7,391,839 | B2 * | 6/2008 | Thompson ................... 375/376 |
| 7,583,152 | B2 | 9/2009 | Zhang |
| 2007/0291173 | A1 | 12/2007 | Hsin |
| 2009/0175399 | A1 * | 7/2009 | Sun et al. ................... 375/376 |
| 2009/0256601 | A1 | 10/2009 | Zhang et al. |

OTHER PUBLICATIONS

R. Staszewski, et al., "1.3 V 20ps Time-to-Digital Converter for Frequency Synthesis in 90-nm CMOS", IEEE Transactions on Circuits and Systems-II, Express Briefs, vol. 53, No. 3, Mar. 2006.
Ioannis L Syllaios et al: "Time-Domain Modeling of an RF All-Digital PLL" IEEE Transactions on Circuits and Systems II: Express Briefs, IEEE, US, vol. 55, No. 6, (Jun. 1, 2008), pp. 601-605, XP011206537.
International Search Report-PCT/US09/052813, International Search Authority-European Patent Office-Nov. 11, 2009.
Written Opinion-PCT/US09/052813, International Search Authority-European Patent Office-Nov. 11, 2009.

* cited by examiner

*Primary Examiner*—Lincoln Donovan
*Assistant Examiner*—William Hernandez
(74) *Attorney, Agent, or Firm*—Jiayu Xu

(57) ABSTRACT

Techniques for converting an accumulated phase of a signal into a digital value in a digital phase-locked loop (DPLL). In an exemplary embodiment, a signal is coupled to a divide-by-N module that divides the frequency of the signal down by a divider ratio N. The divided signal is input to a delta phase-to-digital converter, which measures the phase difference between a rising edge of the divided signal and a rising edge of a reference signal. The accumulated divider ratios and the measured phase differences are combined to give an accumulated digital phase. Further techniques for varying the divider ratio N using a sigma-to-delta modulator are disclosed.

14 Claims, 7 Drawing Sheets

ACCUMULATED PHASE-TO-DIGITAL CONVERSION IN DIGITAL PHASE LOCKED LOOPS

TECHNICAL FIELD

The disclosure relates to the design of digital phase-locked loops (DPLL's), and more specifically, to techniques for accumulated phase-to-digital conversion in DPLL's.

BACKGROUND

In modern communications circuitry, digital phase-locked loops (DPLL's) are used to generate signals of arbitrary frequency by phase locking to a reference signal having a known frequency. To digitally compare the phase of a DPLL output signal with the phase of a reference signal, the DPLL may employ a mixed-signal block known as an accumulated phase-to-digital converter (APDC). The APDC generates a digital representation of an accumulated phase of the DPLL output signal.

In conventional DPLL's, an APDC may be implemented using a counter combined with a time-to-digital converter (TDC). The counter may count the integer portion of the accumulated output signal phase in cycles of the output signal, while the TDC may measure the fractional portion of the accumulated output signal phase. The counter and TDC outputs may be combined to produce the total accumulated output signal phase.

For DPLL's that generate high-frequency output signals, the counter and TDC may both be required to operate at correspondingly high frequencies. For example, the counter is required to count the total number of elapsed cycles at the frequency of the output signal, while the buffers in a delay line of the TDC may also be required to switch at the frequency of the output signal. High-frequency operation of DPLL components circuitry generally leads to higher power consumption by the DPLL. Furthermore, to match a fractional portion of the accumulated output signal phase with the corresponding integer portion, the signal path delays in the counter and TDC should be precisely matched. This requirement further complicates the design of APDC's.

It would be desirable to provide a novel APDC that offers both improved power efficiency and ease of design over prior art APDC's.

SUMMARY

An aspect of the present disclosure provides a method for generating a digital representation of an accumulated phase of a target signal, the method comprising: dividing the frequency of the target signal by a divider ratio N to generate a divided signal; accumulating the divider ratio N into an accumulated integer phase; generating a digital representation of a phase difference between an event in the divided signal and a corresponding event in a reference signal; and combining the accumulated integer phase and the digital phase difference to generate the digital representation of the accumulated phase of the target signal.

Another aspect of the present disclosure provides an apparatus for generating a digital representation of an accumulated phase of a target signal, the apparatus comprising: a divide-by-N module configured to divide the frequency of the target signal by a divider ratio N to generate a divided signal; an accumulator for accumulating the divider ratio N into an accumulated integer phase; a delta phase-to-digital converter for generating a digital representation of a phase difference between an event in the divided signal and a corresponding event in a reference signal; and a combiner for combining the accumulated integer phase and the digital phase difference to generate the digital representation of the accumulated phase of the target signal.

Yet another aspect of the present disclosure provides an apparatus for generating a digital representation of an accumulated phase of a target signal, the apparatus comprising: means for dividing the frequency of the target signal by a divider ratio N to generate a divided signal; means for generating a digital representation of a phase difference between the divided signal and a reference signal; and means for combining the accumulated integer phase and the digital phase difference to generate the digital representation of the accumulated phase of the target signal.

Yet another aspect of the present disclosure provides a computer program product for generating a digital representation of an accumulated phase of a target signal, the product comprising: computer-readable medium comprising: code for causing a computer to divide the frequency of the target signal by a divider ratio N to generate a divided signal; code for causing a computer to accumulate the divider ratio N into an accumulated integer phase; code for causing a computer to generate a digital representation of a phase difference between an event in the divided signal and a corresponding event in a reference signal; and code for causing a computer to combine the accumulated integer phase and the digital phase difference to generate the digital representation of the accumulated phase of the target signal.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
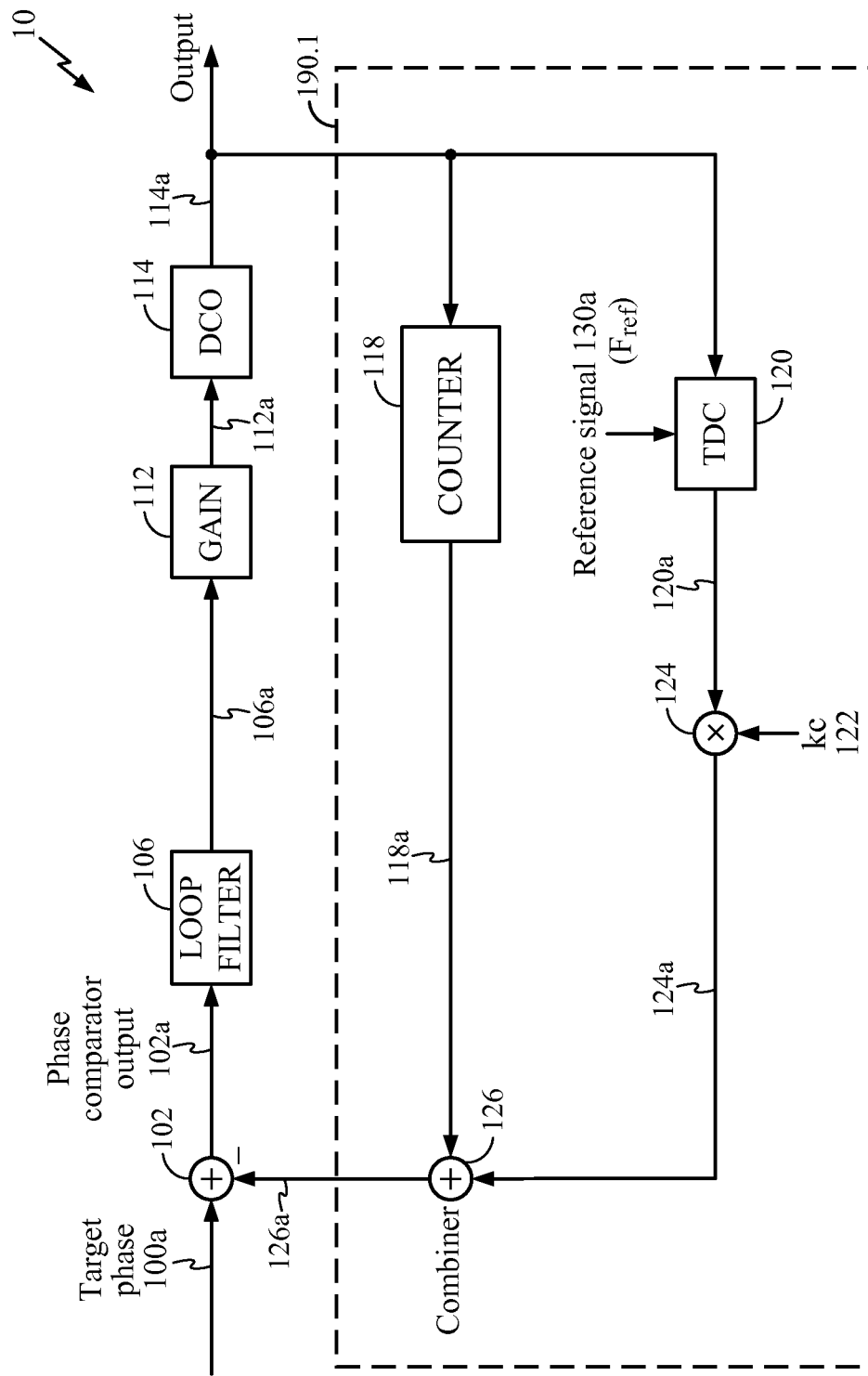
FIG. 1 depicts an implementation of a prior art DPLL 10.

FIG. 1 depicts an implementation of a prior art DPLL 10. The DPLL 10 includes a digital phase comparator 102, digital loop filter 106, digitally controlled oscillator (DCO) 114, and an accumulated phase-to-digital converter (APDC) 190.1. APDC 190.1 further includes a counter 118, a time-to-digital converter 120, a calibration multiplier 124, and a combiner 126.

During operation, the DCO 114 generates an output signal 114a having a frequency controlled by a digital input signal 112a. The signal 114a is simultaneously provided to both the counter 118 and the TDC 120 of the APDC 190.1. A reference signal 130a is further provided to TDC 120. In an implementation, the frequency (Fref) of the reference signal 130a may be lower than the frequency of the DCO output signal 114a. The counter 118 and TDC 120 may be configured to collectively count the cumulative number of cycles of DCO output signal 114a elapsed at every cycle of reference signal 130a, with the counter 118 counting the integer portion of the elapsed number of cycles, and the TDC 120 computing the residual fractional portion. The TDC output signal 120a is further multiplied 124 by a calibration factor kc 122, before being combined 126 with the counter output 118a to form the combiner output signal 126a. The combiner output signal 126a represents the accumulated phase of the DCO output signal 114a.

As further shown in FIG. 1, the combiner output signal 126a is compared 102 to an accumulated target phase 100a to generate a phase comparator output 102a, which is then provided to a loop filter 106. The loop filter output 106a is provided to a gain element 112 to generate the signal 112a, which is in turn provided to control the frequency of the DCO output signal 114a.

One of ordinary skill in the art will appreciate that the prior art DPLL 10 depicted in FIG. 1 generates an output signal 114a that is phase-locked to the reference signal 130a. Note the DPLL 10 in FIG. 1 is shown for illustrative purposes only. One of ordinary skill in the art will appreciate that the techniques of the present disclosure may be readily applied to alternative DPLL architectures not shown. For example, DPLL 10 may incorporate additional filtering or gain elements not shown in FIG. 1. Furthermore, DPLL 10 may incorporate further elements for modulating the frequency, amplitude, or phase of the DCO output signal using, e.g., two-point modulation techniques well-known in the art. Such exemplary embodiments are contemplated to be within the scope of the present disclosure.

Figure 2:
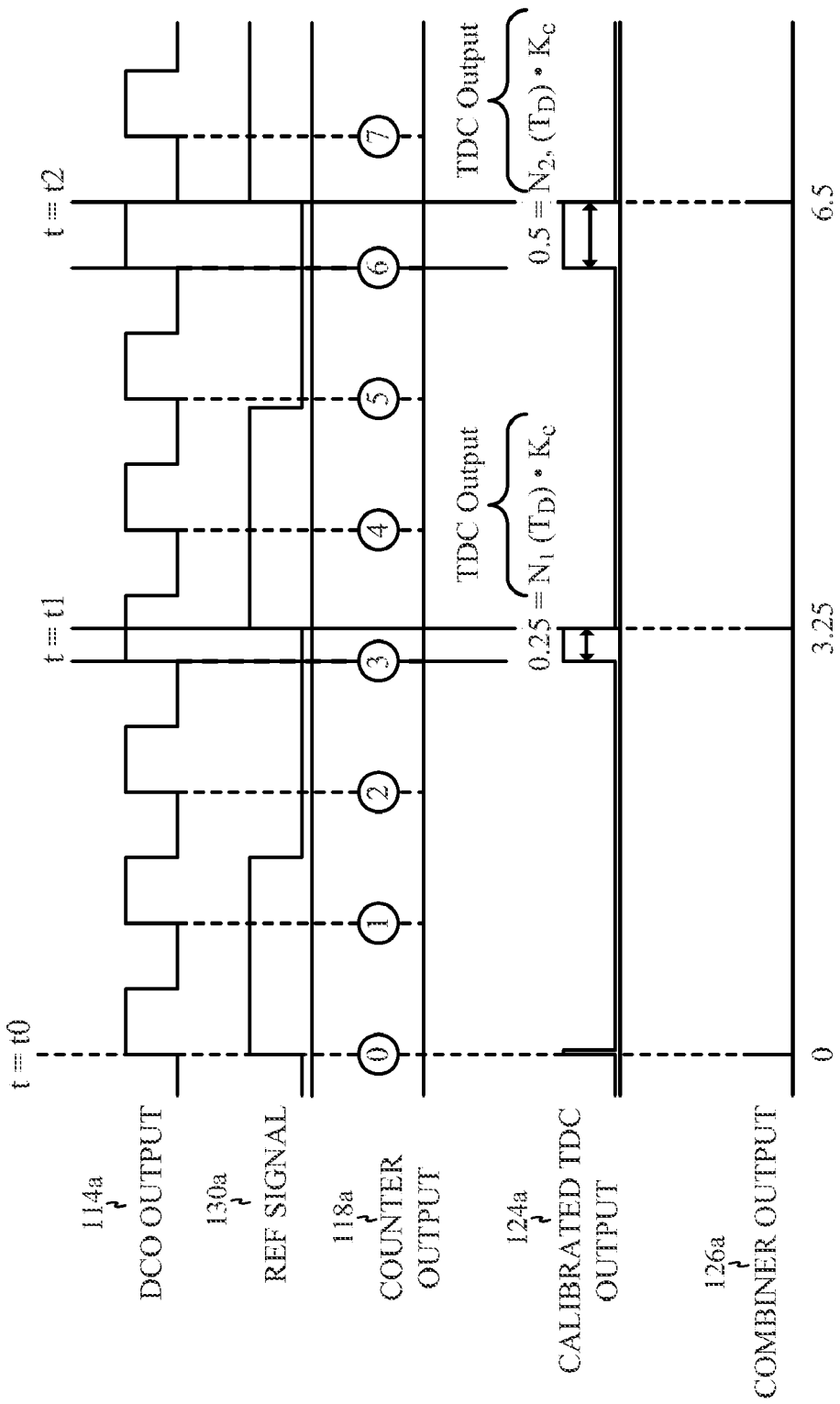
FIG. 2 illustrates an instance of signals present in the prior art DPLL 10 during operation.

FIG. 2 illustrates an instance of signals present in the prior art DPLL 10 during operation. In FIG. 2, an instance of DCO output signal 114a is shown along with an instance of reference signal 130a. Note the signals shown in FIG. 2 are intended for illustration only, and are not meant to restrict the scope of the present disclosure to any particular relationship of the output signal 114a to the reference signal 130a shown. In alternative exemplary embodiments (not shown), the relative frequency between the output signal 114a and the reference signal 130a may be higher or lower than that shown in FIG. 2. Such exemplary embodiments are contemplated to be within the scope of the present disclosure.

In FIG. 2, counter output signal 118a is seen to count the cumulative integer number of cycles of the DCO output signal 114a elapsed since a reference time t=t0. Meanwhile, calibrated TDC output signal 124a is seen to produce, on a rising edge of the reference signal 130a, the time (expressed in cycles of signal 114a) elapsing between the rising edge of the reference signal 130a and the immediately preceding rising edge of the DCO output signal 114a. The combiner output signal 126a is generated by combining the counter output signal 118a with the calibrated TDC output signal 124a on the rising edges of the reference signal 130a. The combiner output signal 126a represents the total accumulated phase of signal 114a since time t=t0.

For example, at time t=t1, the combiner output signal 126a has an integer portion of 3 according to the counter output signal 118a and a fractional portion of 0.25 according to the calibrated TDC output signal 124a, combining for a total output signal of 3.25 cycles. Similarly, at time t=t2, the combiner output signal 126a has an integer portion of 6 according to the counter output signal 118a and a fractional portion of 0.5 according to the calibrated TDC output signal 124a, combining for a total output signal of 6.5 cycles.

Note one of ordinary skill in the art will appreciate that the combiner output signal 126a and other signals shown in FIGS. 1 and 2 may be expressed in any arbitrary units, and the scope of the present disclosure is not limited to any particular units used. For example, the signal 126a may be expressed in cycles of the reference signal 130a, or any scaled version of any units shown or not shown in FIG. 2. Such exemplary embodiments are contemplated to be within the scope of the present disclosure.

The prior art APDC 190.1 incorporating counter 118 and TDC 120 exhibits at least two disadvantages that are addressed by the techniques of the present disclosure.

First, both the counter 118 and TDC 120 in the APDC 190.1 directly operate at the frequency of the DCO output signal 114a. Therefore, when the DCO output signal 114a is a high-frequency signal, the signal switching inside the counter 118 and TDC 120 may consume a correspondingly high level of power. For example, the counter 118 is generally required to keep track of and output the accumulated cycle count for each cycle of the DCO output signal 114a. This is the case even when the output of the counter 118 may be sampled only once per cycle of the relatively low-frequency reference signal 130a, as described with reference to FIG. 2. Furthermore, individual buffers of a delay line within TDC 120 may also be required to toggle at the frequency of the DCO output signal 114a.

Second, both the counter 118 and the TDC 120 in the prior art APDC 190.1 accept the DCO output signal 114a as an input signal, requiring separate instances of the DCO output signal 114a to be provided within the APDC 190.1. Mismatches in the delays of such separate instances of DCO output signal 114a may result in mis-counting the cycles of the DCO output signal 114a. Thus in designing circuitry for the APDC 190.1, careful matching of the signal path delays in the APDC 190.1 is generally required.

According to the present disclosure, a novel APDC incorporating a divide-by-N module and a delta phase-to-digital converter (ΔPDC) is described. The novel APDC may consume lower power and may be easier to design than the prior art APDC 190.1.

Figure 3:
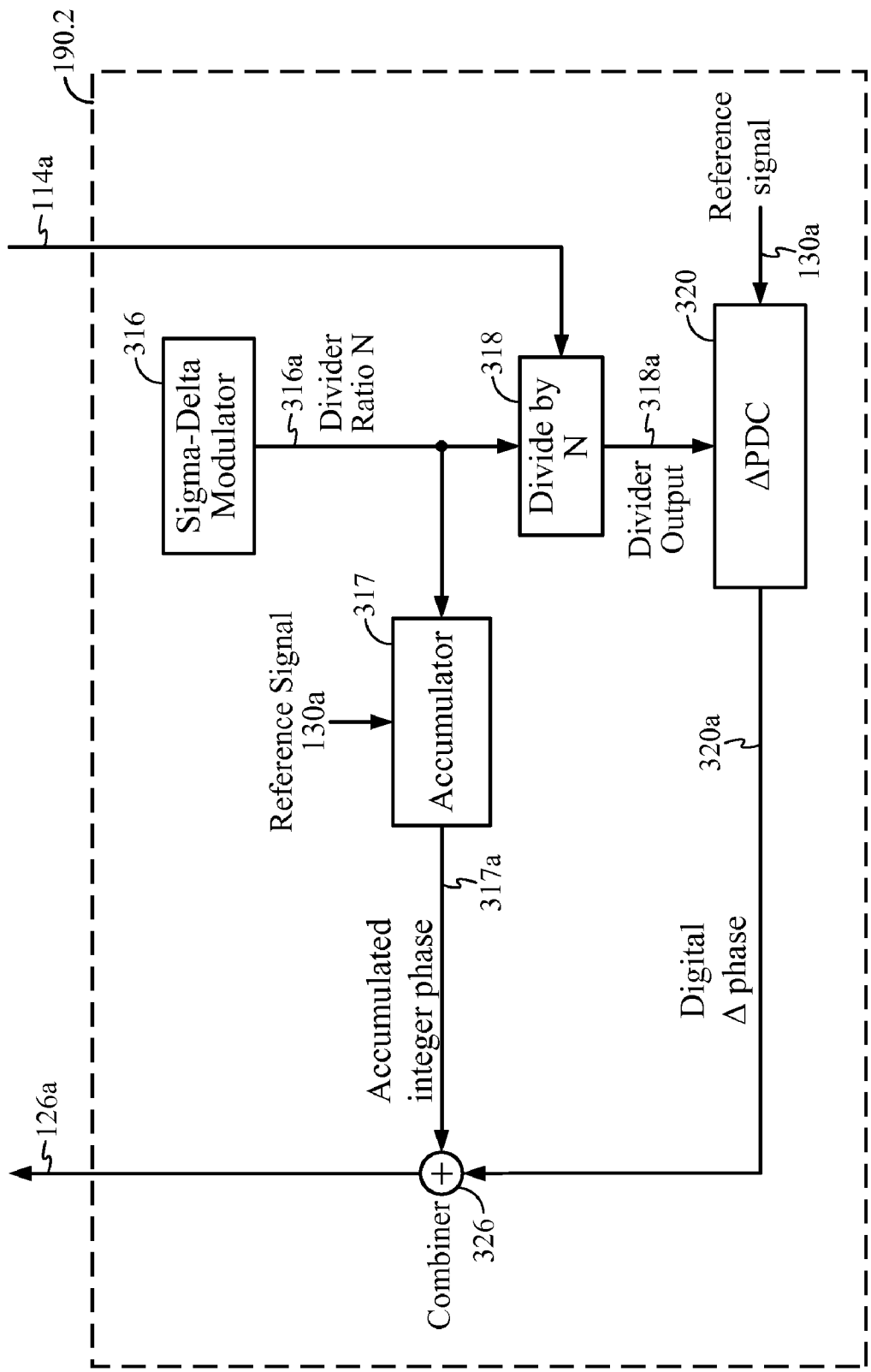
FIG. 3 depicts an embodiment 190.2 of an APDC according to the present disclosure.

FIG. 3 depicts an embodiment 190.2 of a novel APDC according to the present disclosure. In FIG. 3, the DCO output signal 114a is coupled to a divide-by-N module 318, which divides the frequency of the DCO output signal 114a down by a divider ratio N, or 316a, to generate a divided signal 318a. In the exemplary embodiment shown, the divider ratio N 316a is generated by a sigma-delta modulator 316, although the present disclosure need not be limited to embodiments wherein the divider ratio N is generated by a sigma-delta modulator. An accumulator 317 accumulates the divider ratio N 316a on the rising edges of reference signal 130a to generate an accumulated integer phase 317a.

During operation, the DCO output signal 114a is divided down in frequency by divide-by-N module 318 to generate a divided signal 318a. In an exemplary embodiment, the divide-by-N module 318 is configured to output one pulse for every N cycles of DCO output signal 114a, wherein N is an integer divider ratio. The divider ratio N 316a is generally chosen to approximately correspond to the ratio between a desired frequency of the DCO output signal 114a and the frequency of the reference signal 130a. To generate non-integer (i.e., fractional) ratios between signal 114a and signal 130a, the divider ratio N 316a may be varied over time, e.g., on a per reference cycle basis, such that the average of the divider ratio N over a plurality of such reference cycles corresponds to the desired fractional ratio.

In an exemplary embodiment, the variation of the divider ratio N over time may be performed in a pseudorandom manner to avoid periodic error bias in the measured accumulated phase. This may be accomplished by using, e.g., a sigma-delta modulator 316. Note one of ordinary skill in the art will appreciate that pseudorandom divider ratios N may also be generated using means other than a sigma-delta modulator 316. Such alternative exemplary embodiments are contemplated to be within the scope of the present disclosure.

The divider output signal 318a is provided to a delta phase-to-digital converter (ΔPDC) 320, which generates a digital representation 320a of the phase difference between the divider output signal 318a and the reference signal 130a. The accumulated integer phase 317a and phase difference 320a are combined 326 to generate the combiner output signal 126a.

Figure 4:
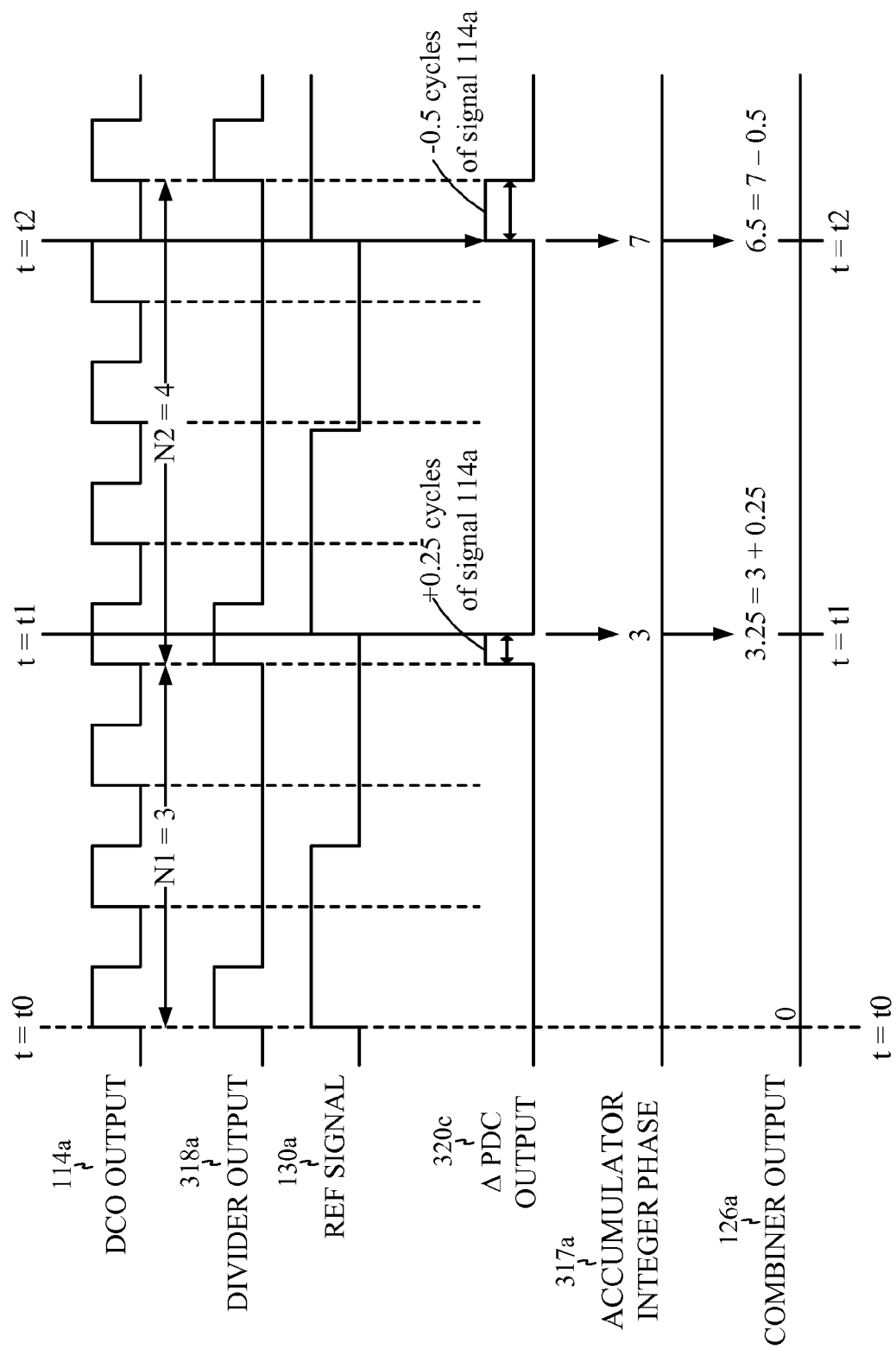
FIG. 4 illustrates an instance of signals present in the APDC 190.2 during operation.

To further clarify the operation of APDC 190.2, FIG. 4 illustrates an instance of signals present in the APDC 190.2, using the same instances of DCO output signal 114a and reference signal 130a depicted in FIG. 2. In FIG. 4, the DCO output signal 114a is processed by divide-by-N module 318 to generate signal 318a. In the exemplary embodiment shown, the divider ratio is first configured to have a value N1=3, and subsequently configured to have a value N2=4, in accordance with the principles earlier described for varying the divider ratio N. Accordingly, the divider output signal 318a includes one pulse for the first three cycles of DCO output signal 114a shown, and one pulse for the next four cycles of DCO output signal 114a.

In the exemplary embodiment shown, the APDC output signal 320a is generated by comparing the rising edge of the divider output signal 318a to a corresponding rising edge of the reference signal 130a. For example, at time t=t1, the ΔPDC output signal 320a indicates that the rising edge of divider output signal 318a precedes (i.e., ΔPDC output signal 320a is positive) a corresponding rising edge of the reference signal 130a by 0.25 cycles of signal 114a. At time t=t2, the ΔPDC output signal 320a indicates that the rising edge of divider output signal 318a trails (i.e., APDC output signal 320a is negative) a corresponding rising edge of the reference signal 130a by 0.5 cycles of signal 114a.

Note the instances of APDC output signal 320a shown are for illustrative purposes only, and are not meant to limit the scope of the present disclosure to any particular technique for measuring the phase difference between two signals. In alternative exemplary embodiments (not shown), the phase difference between two signals may be derived from events in the signals other than the rising edge, e.g., a falling edge, or any other periodic signal characteristic. Such alternative embodiments are contemplated to be within the scope of the present disclosure.

As further shown in FIG. 4, the accumulated integer phase 317a accumulates the divider ratios N1, N2, etc., on the rising edges of the reference signal 130a, to provide a running count of the accumulated DCO cycles elapsed since t=t0. The combiner output signal 126a combines the accumulated integer phase 317a and the APDC output signal 320a to generate the total accumulated phase of the DCO output signal 114a on the rising edges of the reference signal 130a. For example, at time t=t1, an accumulated integer phase 317a of 3 is combined with the ΔPDC output signal 320a of 0.25 to generate 3.25 total cycles for the total accumulated phase of the DCO output signal 114a. At time t=t2, the accumulated integer phase 317a of 7 is combined with the ΔPDC output signal 320a of −0.5 to generate 6.5 total cycles for the total accumulated phase of the DCO output signal 114a.

One of ordinary skill in the art will appreciate that the design of APDC 190.2 affords several advantages over that of the prior art APDC 190.1.

First, the output signal 318a of the divide-by-N module 318 in the APDC 190.2 generally transitions at a frequency N times less than the frequency of the DCO output signal 114a, while the buffers of a delay line within ΔPDC 320 correspondingly switch at the lower, divided frequency. Thus APDC 190.2 may generally consume less power than the corresponding APDC 190.1, whose components are required to operate directly at the frequency of the DCO output signal 114a.

Second, the APDC 190.2 requires only a single instance of the DCO output signal 114a to be provided to the divide-by-N module 318, thus avoiding the mis-counting problems arising from signal delay mismatch. This makes APDC 190.2 generally easier to design than the APDC 190.1, which requires careful signal path delay matching as earlier described.

Figure 5:
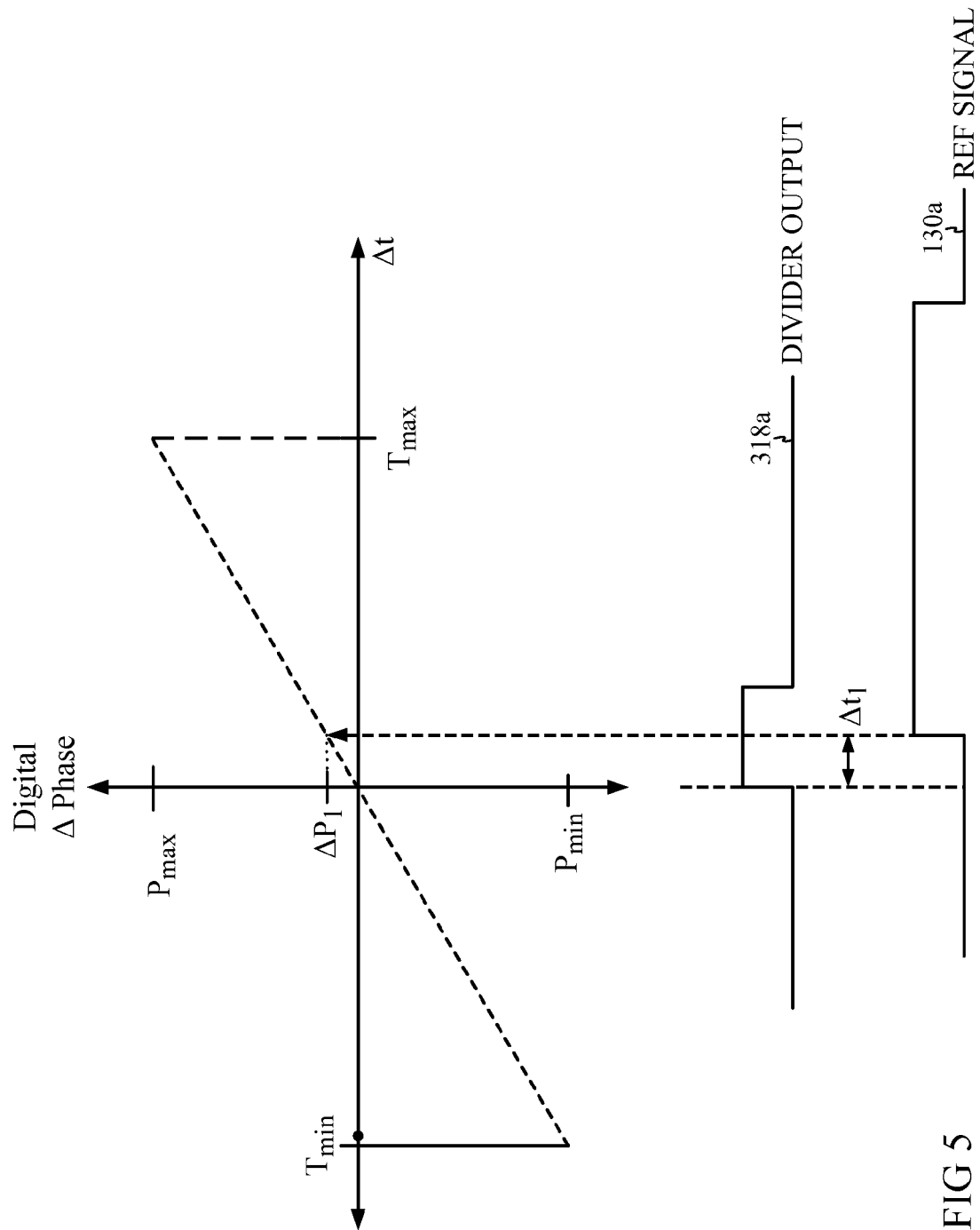
FIG. 5 illustrates an exemplary transfer function for the APDC 320 depicted in FIG. 3.

To further clarify the functionality of ΔPDC 320, FIG. 5 illustrates an exemplary transfer function for the ΔPDC 320 depicted in FIG. 3. In FIG. 5, the ΔPDC is seen to convert a time interval Δt1 between the rising edge of divider output signal 318a and the rising edge of reference signal 130a into a corresponding digital phase difference ΔP1. In the exemplary embodiment shown, the digital phase difference ΔP1 is positive when the rising edge of signal 318a precedes the rising edge of signal 130a, and negative when the rising edge of signal 130a precedes the rising edge of signal 318a. In alternative exemplary embodiments (not shown), the polarity of the digital phase difference ΔP1 may be reversed.

The ΔPDC depicted in FIG. 5 may accommodate a time interval Δt1 ranging from a negative time interval Tmin (i.e., wherein signal 130a rising edge precedes signal 318a rising edge) to a positive time interval Tmax (i.e., wherein signal 318a rising edge precedes signal 318a rising edge). These time intervals correspond to a digital phase difference ΔP1 ranging from a negative phase difference Pmin to a positive phase difference Pmax. One of ordinary skill in the art will appreciate that the time/phase ranges that the ΔPDC is required to accommodate may depend on, e.g., the expected accuracy of the divider ratio N used to approximate the ratio between the frequency of the DCO output signal 114a and the reference signal 130a.

Note the transfer function in FIG. 5 is shown for illustrative purposes only, and is not meant to limit the scope of the present disclosure to any particular technique for phase-to-digital conversion.

Figure 6:
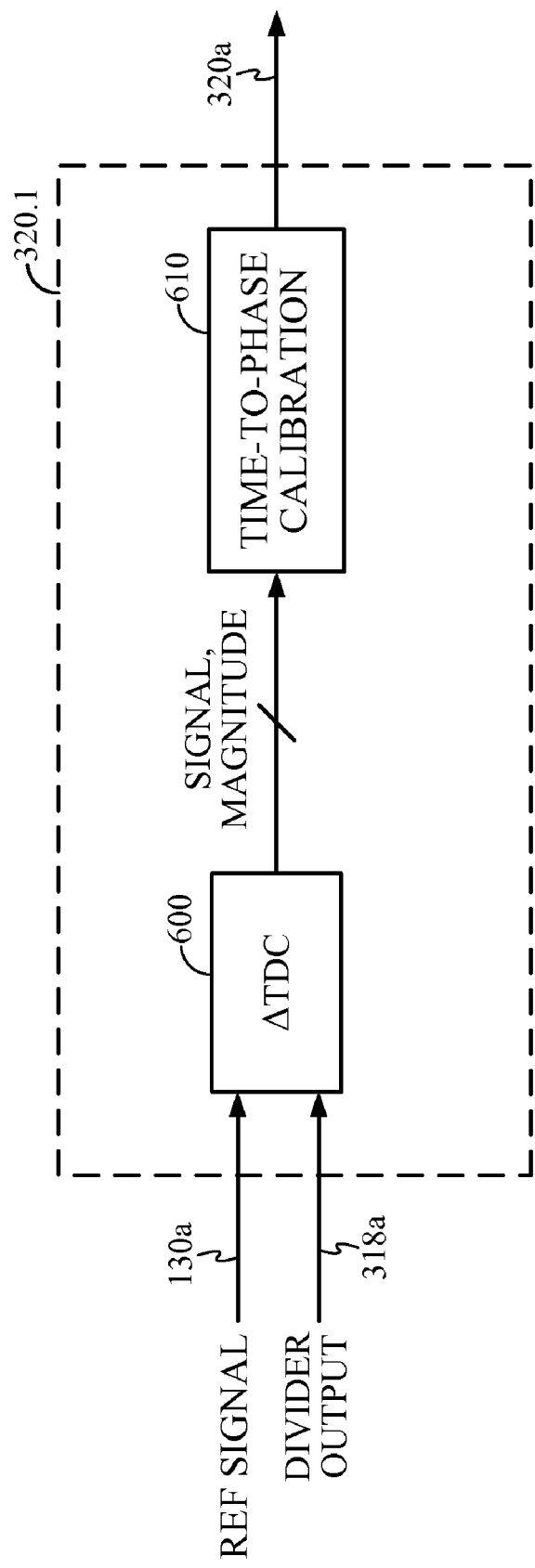
FIG. 6 depicts an exemplary embodiment of a APDC for use in the APDC 190.2.

FIG. 6 depicts an exemplary embodiment 320.1 of a ΔPDC for use in the APDC 190.2. In FIG. 6, the ΔPDC 320.1 is seen to incorporate a differential time-to-digital converter 600 (ΔTDC). The ΔTDC 600 measures the magnitude of the time interval Δt1 between the signals 130a and 318a depicted in FIG. 5, and also provides information on whether the rising edge of signal 130a precedes or lags the rising edge of signal 318a. Following the ΔTDC 600, a time-to-phase calibration module 610 is provided to normalize the units of the ΔTDC 600 output signal to units of the phase of DCO output signal 114a. For example, the time-to-phase calibration module 610 may convert a signal from units of TDC buffer delays into cycles of DCO output signal 114a.

Note the ΔPDC embodiment in FIG. 6 is shown for illustrative purposes only, and is not meant to limit the scope of the present disclosure to any particular exemplary embodiment of a ΔPDC explicitly shown. One of ordinary skill in the art may readily derive an implementation of a ΔPDC based on the characteristics described with reference to FIG. 5. In an exemplary embodiment, the ΔPDC may be designed according to the principles disclosed in U.S. patent application Ser. No. 12/102,768, "Phase to digital converter in all digital phase locked loop," filed Apr. 18, 2008, and U.S. patent application Ser. No. 11/969,364, "Phase-locked loop with self-correcting phase-to-digital transfer function," filed Jan. 4, 2008, both assigned to the assignee of the present application, the contents of which are hereby incorporated by reference herein in their entirety.

Figure 7:
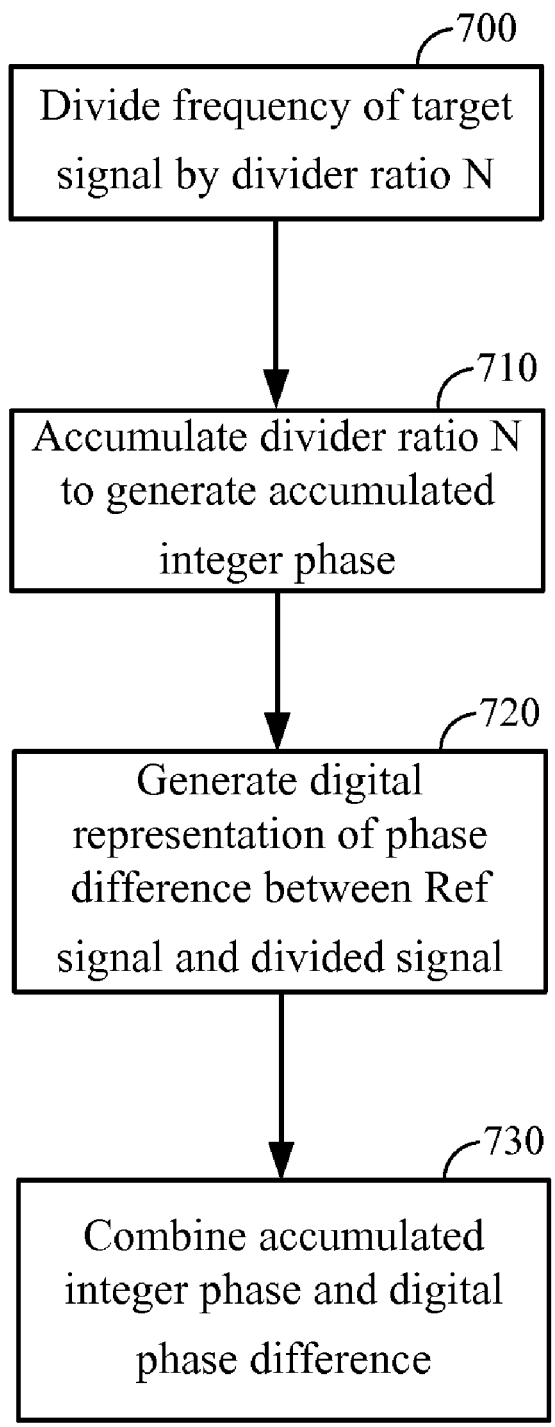
FIG. 7 depicts an exemplary embodiment of a method according to the present disclosure.

FIG. 7 depicts an exemplary embodiment of a method according to the present disclosure. Note the method depicted in FIG. 7 is meant for illustration only, and is not meant to limit the scope of the present disclosure to any particular embodiment of a method. In FIG. 7, at step 700, the frequency of a target signal is divided by a divider ratio N. At step 710, the divider ratio N is accumulated to generate an accumulated integer phase. At step 720, a digital representation of the phase difference between the reference signal ad the divided signal is generated. At step 730, the accumulated integer phase and the digital phase difference are combined to generate the digital representation of the accumulated phase of the target signal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for generating a digital representation of an accumulated phase of a target signal, the method comprising:
   dividing the frequency of the target signal by a divider ratio N to generate a divided signal;
   accumulating the divider ratio N into an accumulated integer phase;
   generating a digital representation of a phase difference between an event in the divided signal and a corresponding event in a reference signal; and
   combining the accumulated integer phase and the digital phase difference to generate the digital representation of the accumulated phase of the target signal.

2. The method of claim 1, the event in the divided signal being a rising edge, the corresponding event in the reference signal being a corresponding rising edge.

3. The method of claim 1, the dividing the frequency of the target signal by a divider ratio N comprising generating a single pulse for every N pulses of the target signal.

4. The method of claim 1, further comprising selecting the divider ratio N to approximately correspond to the ratio of the frequency of the target signal to the frequency of the reference signal.

5. The method of claim 4, further comprising varying the divider ratio N using a sigma-delta modulator.

6. The method of claim 1, the target signal being an output signal of a digitally controlled oscillator (DCO) in a digital phase-locked loop (DPLL), the digital representation of the accumulated phase of the target signal being compared to an accumulated reference phase in the DPLL.

7. An apparatus for generating a digital representation of an accumulated phase of a target signal, the apparatus comprising:
   a divide-by-N module configured to divide the frequency of the target signal by a divider ratio N to generate a divided signal;
   an accumulator to accumulate the divider ratio N into an accumulated integer phase;
   a delta phase-to-digital converter to generate a digital representation of a phase difference between an event in the divided signal and a corresponding event in a reference signal; and
   a combiner to combine the accumulated integer phase and the digital phase difference to generate the digital representation of the accumulated phase of the target signal.

8. The apparatus of claim 7, the event in the divided signal being a rising edge, the corresponding event in the reference signal being a corresponding rising edge.

9. The apparatus of claim 7, the divide-by-N module configured to generate a single pulse for every N pulses of the target signal.

10. The apparatus of claim 7, the divider ratio N selected to approximately correspond to the ratio of the frequency of the target signal to the frequency of the reference signal.

11. The apparatus of claim 10, further comprising a sigma-delta modulator configured to vary the divider ratio N.

12. The apparatus of claim 7, the target signal being an output signal of a digitally controlled oscillator (DCO) in a digital phase-locked loop (DPLL), the digital representation of the accumulated phase of the target signal being compared to an accumulated reference phase in the DPLL.

13. An apparatus for generating a digital representation of an accumulated phase of a target signal, the apparatus comprising:
   means for dividing the frequency of the target signal by a divider ratio N to generate a divided signal;
   means for accumulating the divider ratio N into an accumulated integer phase;
   means for generating a digital representation of a phase difference between the divided signal and a reference signal; and
   means for combining the accumulated integer phase and the digital phase difference to generate the digital representation of the accumulated phase of the target signal.

14. The apparatus of claim 13, further comprising means for pseudorandomly modulating the divider ratio N.

* * * * *